US008803866B2

(12) United States Patent
Lee

(10) Patent No.: US 8,803,866 B2
(45) Date of Patent: Aug. 12, 2014

(54) DISPLAY PANEL INCLUDING TEST PAD UNIT AND FLAT PANEL DISPLAY APPARATUS INCLUDING THE DISPLAY PANEL

(75) Inventor: Hee-Kwon Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 136 days.

(21) Appl. No.: 13/478,374

(22) Filed: May 23, 2012

(65) Prior Publication Data

US 2012/0327056 A1 Dec. 27, 2012

(30) Foreign Application Priority Data

Jun. 24, 2011 (KR) ........................ 10-2011-0061791

(51) Int. Cl.
*G09G 3/00* (2006.01)
*G01R 31/28* (2006.01)

(52) U.S. Cl.
USPC ........................................ 345/211; 324/750.3

(58) Field of Classification Search
CPC .............. G09G 3/006; G09G 2300/04; G09G 2300/0421; G09G 2300/0426
USPC ...................... 345/76–81, 211–215; 324/511, 324/522–524, 527–533, 750.3
See application file for complete search history.

(56) References Cited

U.S. PATENT DOCUMENTS

| | | | | |
|---|---|---|---|---|
| 7,633,469 | B2 * | 12/2009 | Kawata | 345/76 |
| 2004/0222974 | A1 | 11/2004 | Hong et al. | |
| 2008/0036715 | A1 * | 2/2008 | Lee et al. | 345/87 |
| 2008/0050982 | A1 | 2/2008 | Kaneko | |
| 2009/0284484 | A1 | 11/2009 | Hwang et al. | |
| 2011/0080383 | A1 * | 4/2011 | Huang et al. | 345/204 |

FOREIGN PATENT DOCUMENTS

| | | | |
|---|---|---|---|
| JP | 2008-078628 | A | 4/2008 |
| JP | 2009-133932 | A | 6/2009 |
| KR | 10-2004-0061502 | A | 7/2004 |
| KR | 10-2009-0062078 | A | 6/2009 |
| KR | 10-2009-0119600 | A | 11/2009 |

* cited by examiner

*Primary Examiner* — Nathan Danielsen
(74) *Attorney, Agent, or Firm* — Lee & Morse, P.C.

(57) ABSTRACT

A display panel includes a display unit including a plurality of pixels, and a test pad unit having a plurality of pads configured to transmit a test signal to the display unit during a test period, the plurality of pads being disabled after the test period is completed, the test pad unit including a plurality of first pads that transmit the test signal, applied from outside during the test period, to the display unit, and a plurality of second pads and an auxiliary pad that disable the plurality of first pads when the test period is completed.

22 Claims, 5 Drawing Sheets

DISPLAY PANEL INCLUDING TEST PAD UNIT AND FLAT PANEL DISPLAY APPARATUS INCLUDING THE DISPLAY PANEL

CROSS-REFERENCE TO RELATED PATENT APPLICATION

This application claims the benefit of Korean Patent Application No. 10-2011-0061791, filed on Jun. 24, 2011, in the Korean Intellectual Property Office, the disclosure of which is incorporated herein in its entirety by reference.

BACKGROUND

1. Field

Embodiments relate to display panels including a test pad and flat panel display apparatuses including the display panels.

2. Description of the Related Art

Display apparatuses have recently replaced portable, thin flat panel display apparatuses. Among the flat panel display apparatuses, field effect light-emitting display apparatuses are self-emissive display apparatuses which have a wide view angle, excellent contrast ratio, and a high response speed. Thus, the field effect light-emitting display apparatuses are being noticed as next-generation display apparatuses. Moreover, organic light-emitting display apparatuses, in which an emissive layer is formed of an organic material, show better characteristics in terms of luminance, driving voltage, and response speed than inorganic light-emitting display apparatuses. Multiple colors may be produced by the organic light-emitting display apparatuses.

SUMMARY

An embodiment is directed to a display panel, including a display unit including a plurality of pixels, and a test pad unit having a plurality of pads configured to transmit a test signal to the display unit during a test period, the plurality of pads being disabled after the test period is completed, the test pad unit including a plurality of first pads that transmit the test signal, applied from outside during the test period, to the display unit, and a plurality of second pads and an auxiliary pad that disable the plurality of first pads when the test period is completed.

The first pads may be arranged in a first direction, and the second pads may be arranged in a second direction that is different from the first direction.

The auxiliary pad may be electrically connected to one of the second pads.

The auxiliary pad may have a surface area that extends in a direction in which the second pads are arranged.

The first pads may include D pads that receive a test data signal from the outside during the test period to transmit the test data signal to the display unit, and a G pad that receives a test gate signal from the outside to transmit the test gate signal to the display unit, the D pads and the G pad being sequentially arranged in a first direction.

The second pads may include a DG pad that receives a disable voltage from the outside to disable the G pad after the test period is completed, and DD pads that receive the disable voltage from the outside to disable the DD pads, the DG pad and the DD pads being sequentially arranged in a second direction that is different from the first direction.

The first pads and the second pads may cross each other, and the G pad and the DG pad may be common pads, the G pad and the DG pad being disposed at a contact point where the first pads and the second pads cross each other.

The auxiliary pad may be electrically connected to the DG pad.

The pixels may each include an organic light-emitting device.

Another embodiment is directed to a flat panel display apparatus, including a display panel including a display unit that includes a plurality of pixels, and a test pad unit configured to transmit a test signal to the display unit during a test period, the test pad unit having a plurality of pads that are disabled after the test period is completed, and a flexible circuit board including a lead terminal portion that is connected to the test pad unit. The test pad unit may include first pads that transmit the test signal, applied from outside during the test period, to the display unit; and second pads and an auxiliary pad that disable the first pads when the test period is completed. The lead terminal portion may apply a common disable voltage to the second pads and the auxiliary pad after the test period is completed. The lead terminal portion may include a main terminal portion that is connected to the second pads, and an auxiliary terminal portion that is connected to the auxiliary pad.

The first pads may be arranged in a first direction, and the second pads may be arranged in a second direction that is different from the first direction.

The auxiliary pad may be electrically connected to one of the second pads.

The auxiliary pad may have a surface area that extends in a direction in which the second pads are arranged.

The first pads may include D pads that receive a test data signal from the outside during the test period to transmit the test data signal to the display unit, and a G pad that receives a test gate signal from the outside to transmit the test gate signal to the display unit, the D pads and the G pad being sequentially arranged in a first direction.

The second pads may include a DG pad that receives a disable voltage from the outside to disable the G pad after the test period is completed, and DD pads that receive the disable voltage from the outside to disable the D pads, the DG pad and the DD pads being sequentially arranged in a second direction that is different from the first direction.

The first pads and the second pads may cross each other, and the G pad and the DG pad may be common pads, the G pad and the DG pad being disposed at a contact point where the first pads and the second pads cross each other.

The auxiliary pad may be electrically connected to the DG pad.

At least the DD pads may be connected to the main terminal portion.

The DD pads and the DG pad may be connected to the main terminal portion.

The flat panel display apparatus may further include a driving circuit unit that is electrically connected to the flexible circuit board, the driving circuit unit applying the common disable voltage to the second pads and the auxiliary pad after the test period is completed.

The flat panel display apparatus may further include a driving pad unit that is included in the display panel and supplies power and control signals, the power and control signals being received from the driving circuit unit when driving the display unit. The driving circuit unit may apply the power and control signals to the driving pad unit when driving the display unit.

The pixels may each include an organic light-emitting device.

BRIEF DESCRIPTION OF THE DRAWINGS

The above and other features and advantages will become more apparent by describing in detail exemplary embodiments with reference to the attached drawings in which.

DETAILED DESCRIPTION

Figure 1:
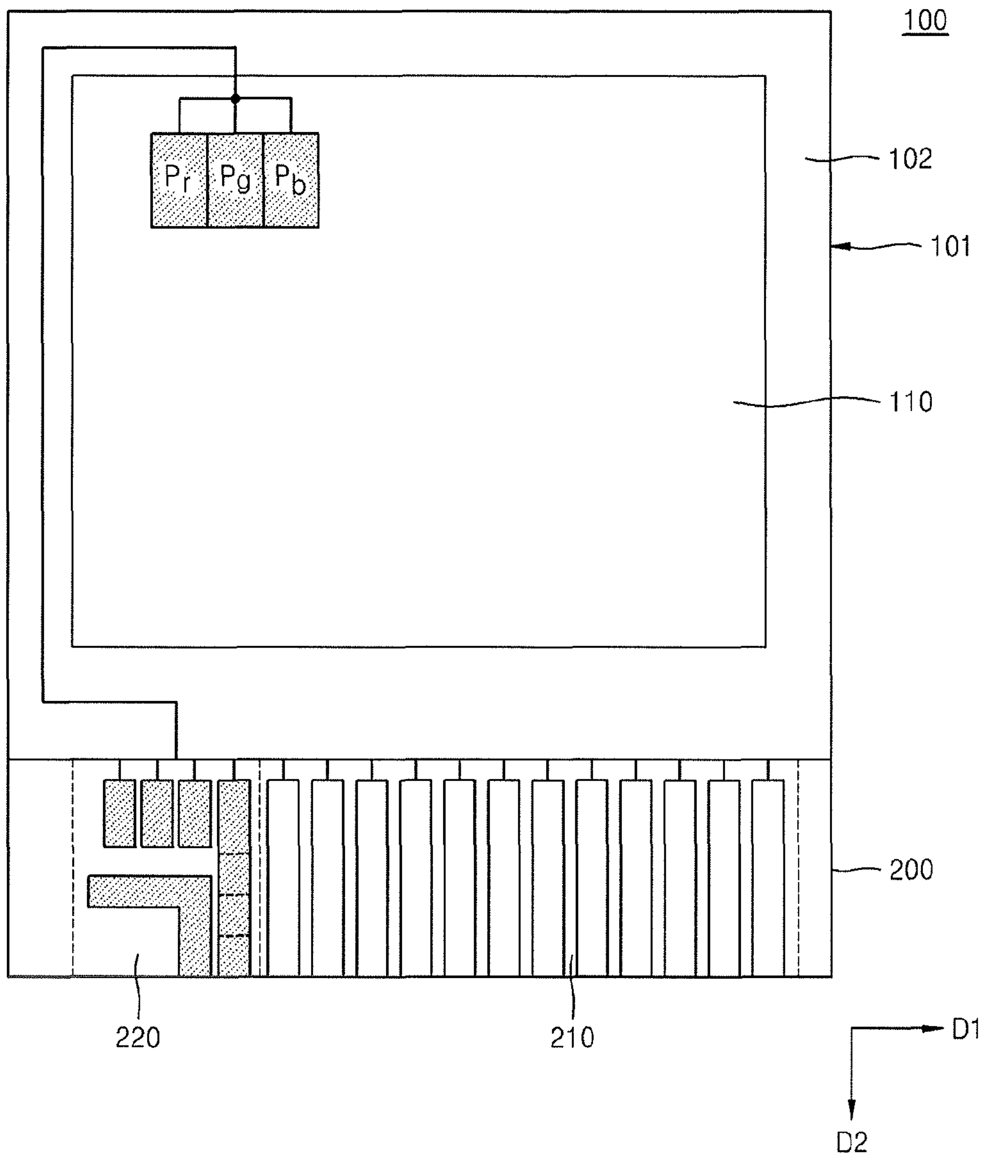
FIG. 1 is a schematic view illustrating a display panel according to an embodiment.

As the invention allows for various changes and numerous embodiments, embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various components, such components must not be limited to the above terms. The above terms are used only to distinguish one component from another.

The terms used in the present specification are merely used to describe embodiments, and are not intended to limit embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The present invention will now be described more fully with reference to the accompanying drawings, in which exemplary embodiments of the invention are shown.

FIG. 1 is a schematic view illustrating a display panel 100 according to an embodiment.

Referring to FIG. 1, the display panel 100 includes a display unit 110 and a pad unit 200. The display unit 110 is disposed in a sealing area between a first substrate 101 and a second substrate 102, and the pad unit 200 includes a plurality of pads that transmit various powers and signals from the outside.

The display unit 110 includes a plurality of pixels Pr, Pg, and Pb disposed on the first substrate 101. The pixels Pr, Pg, and Pb may each include at least one organic light-emitting device. The organic light-emitting device is electrically connected to at least one thin-film transistor, and emits light at a luminance corresponding to driving signals and powers supplied from the outside.

The pad unit 200 may be formed along a side of the first substrate 101. The pad unit 200 includes a driving pad portion 210 and a test pad portion 220. The driving pad portion 210 may include a plurality of pads that are arranged in a first direction D1. For example, the pads may be spaced apart from each other in the first direction D1 while extending in a second direction D2. The driving pad portion 210 transmits various powers and control signals that are supplied from a driving circuit unit 700 (see FIG. 3) via a flexible circuit board 500 (see FIG. 3) when the display unit 110 is actually driven. The actual driving of the display unit 110 refers to a period when the display unit 110 emits light, e.g., to display an image, with the driving circuit unit 700 (see FIG. 3) and the flexible circuit board 500 (see FIG. 3) mounted on the display panel 100, and various power and control signals being applied to the display unit 110 from the driving circuit unit 700 (see FIG. 3) and the flexible circuit board 500 (see FIG. 3). Referring to FIG. 1, the driving circuit unit 700 (see FIG. 3) and the flexible circuit board 500 (see FIG. 3) may not be mounted on the display panel 100, and any signal or power may be transmitted to the driving pad portion 210.

The test pad portion 220 includes a plurality of pads that transmit various test signals to the display unit 110 to test the display unit 110 in a condition as illustrated in FIG. 1, i.e., in a state before the driving circuit unit 700 (see FIG. 3) and the flexible circuit board 500 (see FIG. 3) are mounted on the display panel 100. The test pad portion 220 is electrically connected to each of the pixels Pr, Pg, and Pb via wirings and transmits various types of test signals to the pixels Pr, Pg, and Pb.

A test period refers to a period when test signals are transmitted to the display unit 110 via the test pad portion 220, before mounting the flexible circuit board 500 (see FIG. 3) and the driving circuit unit 700 (see FIG. 3) on the display panel 100. Also, a post-test period refers to a period when a test is completed, and the test pad portion 220 which was necessary for the test is disabled and the driving pad portion 210 is ready to operate.

While only one test pad portion 220 is illustrated in FIG. 1, the embodiment is not limited thereto; one display panel 100 may include a plurality of test pad portions 220. In addition, the positions and alignment of the test pad portions 220 and the driving pad portion 210 are not limited as illustrated in FIG. 1 and may be varied. Also, the position and size of the pad unit 200 and arrangement of the pads of the pad unit 200 are not limited to those of FIG. 1 and may be varied.

Figure 2:
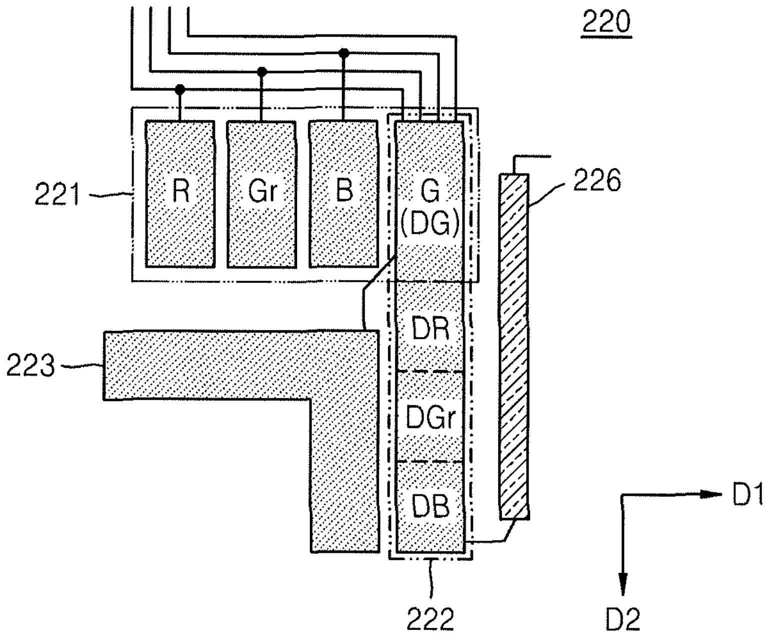
FIG. 2 is a schematic view illustrating a test pad portion of FIG. 1, according to an embodiment.

FIG. 2 is a schematic view illustrating the test pad portion 220 of FIG. 1, according to an embodiment.

Referring to FIG. 2, the test pad portion 220 includes first pads 221, second pads 222, and an auxiliary pad 223. The pads included in the test pad portion 220 are referred to as the first pads 221, the second pads 222, and the auxiliary pad 223 according to functions, for convenience of description. In the present embodiment, one of the first pads 221 and one of the second pads 222 are a pad common to the first and second pads 221 and 222, and may be included commonly in both of the groups of the first pads 221 and the second pads 222.

The first pads 221 are arranged in a first direction D1 (e.g., a horizontal direction) and transmit a test signal from the outside to the display unit 110 during a test period. On the other hand, the second pads 222 are arranged in the second direction D2 which may be substantially perpendicular to the first direction D1, i.e., a longitudinal direction, and disable the first pads 221 using a disable voltage received from the outside when the test is completed, so that the first pads 221 do not continue to operate.

According to an embodiment, by arranging the second pads 222 in the second direction D2 (unlike the first pads 221 arranged in the first direction D1), a length of the flexible circuit board 500 (see FIG. 3), through which a disable voltage is applied, may be shortened in the longitudinal direction. The flexible circuit board 500 (see FIG. 5) is a component that is connected to the pad unit 200 of the display panel 100, and may preferably be designed to have a minimum width because the flexible circuit board 500 may affect other components. Consequently, according to an embodiment, as a size of the flexible circuit board 500 (see FIG. 3) is reduced, the portability of a display apparatus and convenience in regard to storage may be increased. Also, costs of components may be reduced, processes for manufacture may be simplified, and a defect ratio may be reduced.

The first pads 221 include test data signal pads D (referred to herein as "D pads") (e.g., for R, Gr, and B), the D pads transmitting test data signals, and a test gate signal pad G (referred to herein as a "G pad"), the G pad transmitting a test gate signal to the display unit 110.

A test data signal refers to a data signal that is applied to test whether R, G, and B pixels Pr, Pg, and Pb included in the display unit 10 are driven properly. In addition, a test gate signal is a gate signal applied to the pixels Pr, Pg, and Pb included in the display unit 110 to test whether the pixels Pr, Pg, and Pb are driven properly.

The test signals may be transmitted from the outside to the first pads 221, and here, a terminal portion of a test flexible circuit board may be connected to the first pads 221 to apply a test signal to the first pads 221. However, the embodiment is not limited thereto, and test signals may be applied to the first pads 221 using various methods.

The first pads 221 may sequentially include, in the first direction D1, D pads R, Gr, and B and the G pad G. As described below, the G pad G is formed as a common pad with other pad types and thus may be most suitably located in an outermost location among the first pads 221. Although not shown in FIG. 2, the first pads 221 may sequentially include the D pads R, Gr, and B and the G pad G in a reverse direction to the first direction D1.

The second pads 222 sequentially include, in the second direction D2, a test gate signal pad disable pad DG (referred to herein as a "DG pad"), the DG pad disabling the G pad, and test data signal pad disable pads DD (referred to herein as "DD pads") (e.g., DR, DGr, and DB), the DD pads disabling the D pads R, Gr, and B. The second pads 222 receive a disable voltage from the outside to disable the first pads 221.

Figure 3:
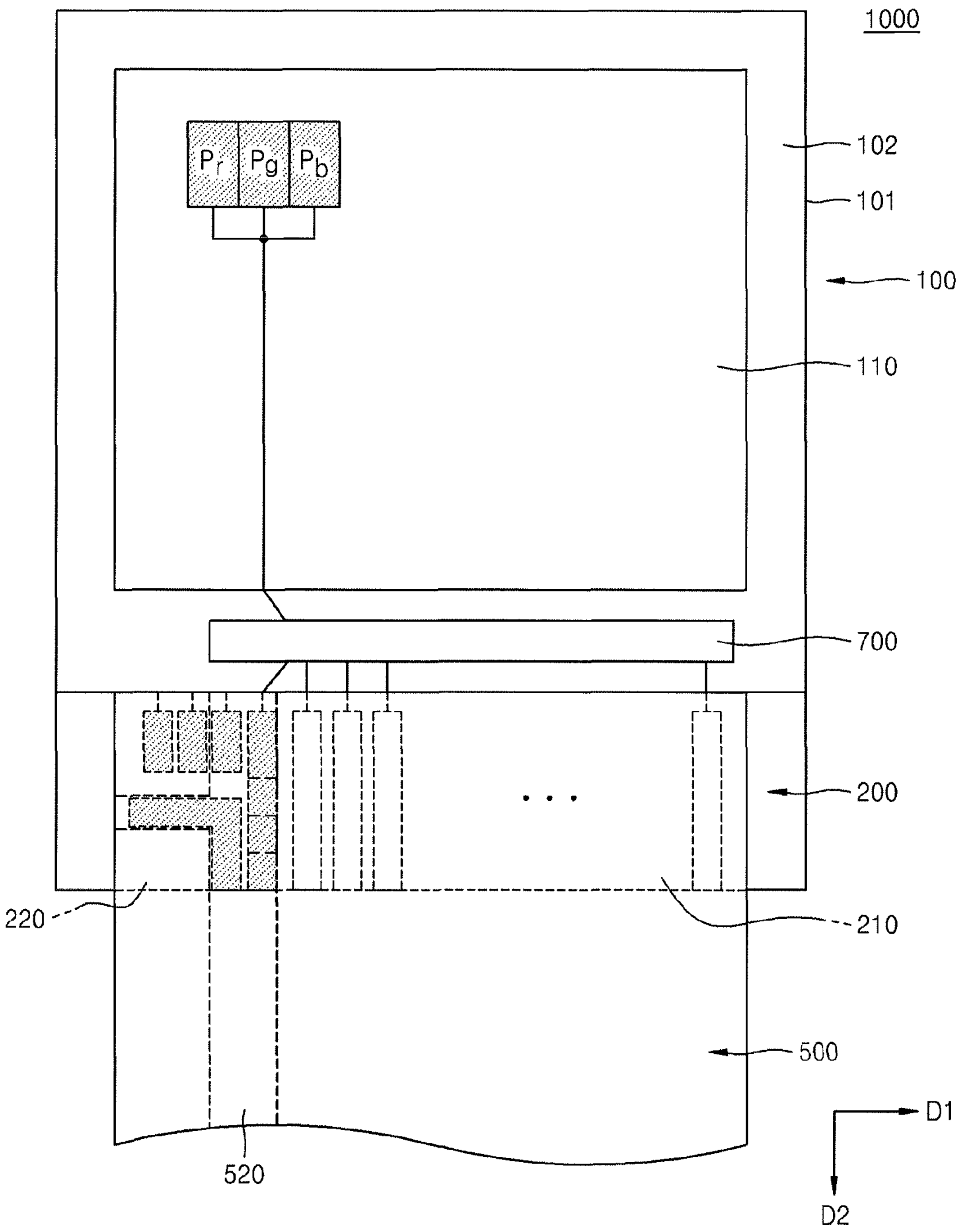
FIG. 3 is a schematic view illustrating a flat panel display apparatus according to an embodiment.

As the G pad G and the DG pad DG are formed as the common pads, the DG pad DG may be most suitably located in an outermost location among the second pads 222. In the example shown in FIG. 2, the first pads 221 are arranged in the first direction D1, the second pads 222 are arranged in the second direction D2, and a contact point is a crossing point therebetween. This contact point is common pads, which is one of the G pad D and the DG pad DG. That is, the G pad G is arranged as the last pad in the first direction D1, and the DG pad DG is arranged as the first pad in the second direction D2, and this test pad is disposed at a lower left portion of the display panel 100 of FIG. 1. Thus, a width of the flexible circuit board 500 of FIG. 3 is minimized in the first direction D1, which is to be connected to the pads after. However, the embodiment is not limited thereto. For example, when a test pad is disposed at a lower right portion of the display panel 100 of FIG. 1, in order to minimize the width of the flexible circuit board 500 of FIG. 3 in the first direction D1, the G pad G may be disposed as the first pad in the first direction D1, and the DG pad DG may be arranged as the first pad in the second direction D2 such that the G pad G and DG pad DG are formed as common pads.

The auxiliary pad 223 is electrically connected to one of the second pads 222. In detail, the auxiliary pad 223 may be electrically connected to the DG pad DG via a bridge. The auxiliary pad 223 is formed to spatially expand the connection area for the DG pad DG, which it may be important pad to ensure a connection to. Accordingly, when the auxiliary pad 223 receives a disable voltage as the DG pad DG does, the auxiliary pad 223 disables the G pad G. The auxiliary pad 223 may be formed as a dummy pattern. The auxiliary pad 223 may preferably be formed to have a surface area that extends in the second direction D2 in which the second pads 222 are arranged.

According to the present embodiment, the auxiliary pad 223 is formed to spatially expand some of the second pads 222 to help ensure connections between the second pads 222 and a lead terminal portion 520 of the flexible circuit board 500 of FIG. 3 (through which a disable voltage is applied as described below) if they are misaligned. In detail, the lead terminal portion 520 (see FIG. 3) is to be connected to all of the second pads 222 and a disable voltage is to be applied to the second pads 222. However, the lead terminal portion 520 of FIG. 3 may not be connected to a pad that is disposed at the outermost location as the DG pad DG in the case of misalignment. Accordingly, by forming the auxiliary pad 223 that is electrically connected to the DG pad DG and has sufficient space, all of the first pads 221 may be electrically connected, and thus disabled by the disable voltage, even if there is misalignment. Accordingly, the auxiliary pad 223 may be formed to have a surface area that extends in a direction in which the DD pads DR, DGr, and DB are arranged (e.g., in the second direction D2), so that the lead terminal portion 520 is connected to all of the DD pads DR, DGr, and DB and is connected to the auxiliary pad 223 even if the lead terminal portion 520 is not connected to the DG pad DG.

While the auxiliary pad 223 illustrated in FIG. 2 has a bent portion that is substantially parallel to the first pads 221 and a portion that is substantially parallel to the second pads 222, the present embodiment is not limited thereto. The auxiliary pad 223 may have various shapes, e.g., polygonal shapes such as a rectangle, a triangle, etc., that provide the auxiliary pad 223 with a surface area extending in a direction in which the second pads 222 are arranged.

In addition, referring to FIG. 2, the second pads 222 may be electrically connected to a diode ring 226 so as to prevent damage due to electrostatic discharge (ESD).

FIG. 3 is a schematic view illustrating a flat panel display apparatus 100 according to an embodiment.

Referring to FIG. 3, the flat panel display apparatus 1000 includes the display panel 100 illustrated in FIG. 1 including the pad unit 200, the flexible circuit board 500 including a lead terminal portion 520 that is connected to the pad unit 200, and the driving circuit unit 700 that is electrically connected to the flexible circuit board 500. The description of the display panel 100 and the pad unit 200 has already been provided in detail with reference to FIGS. 1 and 2, and thus will not be repeated here.

Referring to FIG. 3, besides the test pad portion 220, the flexible circuit board 500 is electrically connected and contacted to the driving pad portion 210. The flexible circuit board 500 includes a plurality of terminal portions; the lead terminal portion 520 may be connected to the test pad, and other terminal portions (not shown) may be connected to the driving pad portion 210. The lead terminal portion 520 is described below with reference to FIG. 4.

The driving circuit unit 700 generates various types of voltages, power, and signals, and applies them to pads. In detail, the driving circuit unit 700 generates driving signals such as a gate signal and R, G, and B data signals, control signals such as a timing signal and an initialization signal, and various powers such as high power or low power to apply them to the driving pad portion 210. The driving circuit unit 700 may generate a disable voltage to apply it to the test pad portion 220.

The driving circuit unit 700 includes a data driving unit and a gate driving unit that respectively supply a data signal and a gate signal to a display unit, and may separately include a control unit and a power supply unit that respectively supply a control signal and power to the data driving unit and the gate driving unit. In FIG. 3, the driving unit, the control unit, and the power supply unit are all included in a single chip, that is, the driving circuit unit 700, to be mounted on the display panel 100. However, the embodiment is not limited thereto, and only a driving unit may be mounted on the display panel 100, and a control unit or a power supply unit of the driving circuit unit 700 may be connected to the other side of the flexible circuit board 500 to be mounted on a rear surface of the display panel 100 separately from the driving unit.

Figure 4:
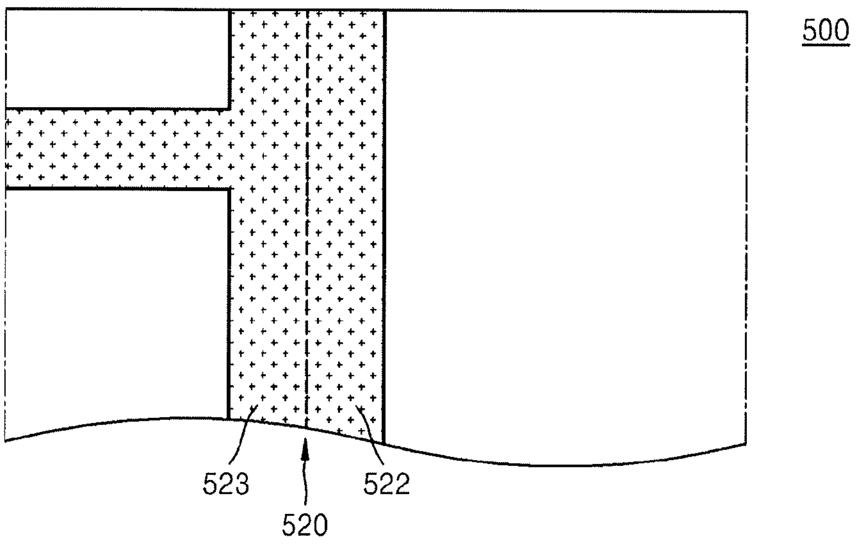
FIG. 4 is a schematic view illustrating a portion of a flexible circuit board including a lead terminal portion illustrated in FIG. 3, according to an embodiment.

FIG. 4 is a schematic view illustrating a portion of the flexible circuit board 500 including the lead terminal portion 520 illustrated in FIG. 3, according to an embodiment.

Referring to FIG. 4, the flexible circuit board 500 includes the lead terminal portion 520 that is electrically connected to the test pad portion 220. After a test of the display unit 110 is completed, the lead terminal portion 520 is electrically connected to the second pads 222 and the auxiliary pad 223, and a disable voltage is transmitted to the second pads 222 and the auxiliary pad 223. As the disable voltage is applied, the test pad portion 220 may be biased to a high voltage to be disabled. The lead terminal portion 520 includes a main terminal portion 522 and an auxiliary terminal portion 523.

The main terminal portion 522 is disposed at a position corresponding to the second pads 222 to electrically connect to the second pads 222. The auxiliary terminal portion 523 is disposed at a position corresponding to the auxiliary pad 223 to electrically connect to the auxiliary pad 223. The same disable voltage is applied to the main terminal portion 522 and the auxiliary terminal portion 523. The disable voltage may be a high voltage of about 5 V, and for example, a voltage of the same amplitude as a positive voltage applied to a gate driver.

According to the present embodiment, in addition to the main terminal portion 522 corresponding to the second pads 222, the auxiliary terminal portion 523 corresponding to the auxiliary pad 223 is formed to maintain a sufficiently broad surface area of the lead terminal portion 520. Accordingly, even if the lead terminal portion 520 and the test pad portion 220 are misaligned, a disable voltage may be still stably supplied to the test pad portion 220.

Figure 5:
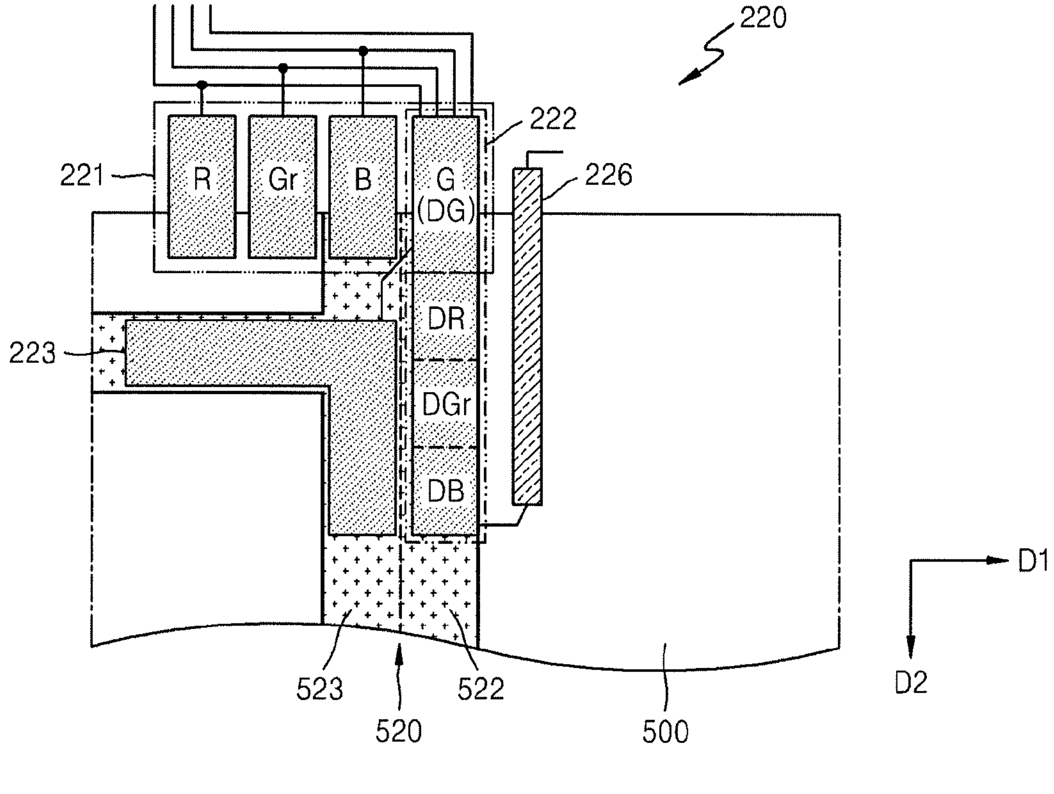
FIG. 5 illustrates a desired alignment of a test pad portion and a lead terminal portion.
Figure 6:
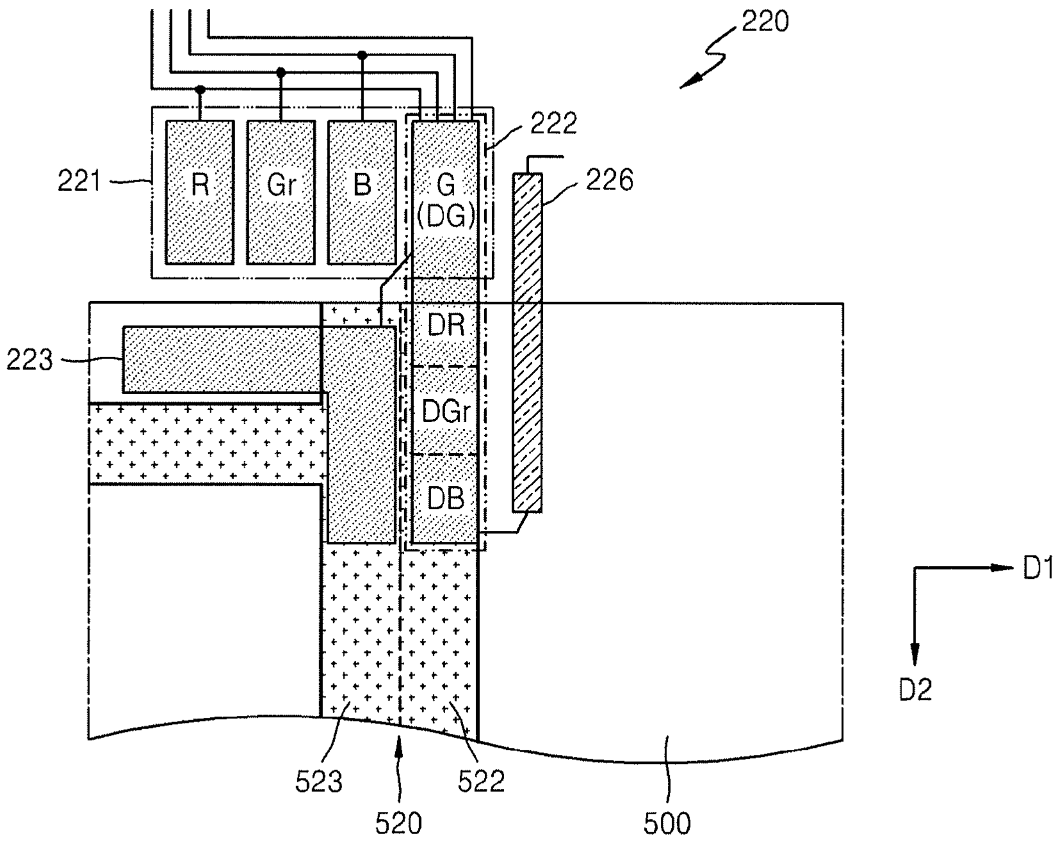
FIG. 6 illustrates a misalignment of a test pad portion and a lead terminal portion.

FIG. 5 illustrates a desired alignment of the test pad portion 220 and the lead terminal portion 520, and FIG. 6 illustrates a misalignment of the test pad portion 220 and the lead terminal portion 520.

Referring to FIG. 5, in a desired or correct alignment, all of the second pads 222 are connected to the main terminal portion 522 to receive a disable voltage from the main terminal portion 522. In particular, FIG. 5 shows that the DG pad DG is also stably connected to the main terminal portion 522. In FIG. 5, the test pad portion 220 and the lead terminal portion 520 are correctly aligned so that all of the first pads 221 may be stably disabled.

Referring to FIG. 6, the flexible circuit board 500 is lower, in the second direction D2, than the position illustrated in FIG. 5, so that the main terminal portion 522 is not connected to the DG pad DG among the second pads 222. In other words, only at least the DD pads DR, DGr, DB are connected to the main terminal pad 522, and the DG pad DG is not connected to the main terminal portion 522. If the auxiliary pad 223 was not formed, a disable voltage may not be applied to the DG pad DG. However, as the auxiliary pad 223, which is electrically connected to the DG pad DG to spatially expand the same, is connected to the auxiliary terminal portion 523, all of the first pads 221 may be stably disabled.

According to the present embodiment, not only when a correct misalignment occurs as illustrated in FIG. 5, but also when an incorrect misalignment occurs as illustrated in FIG. 6, the first pads 221 may be disabled successfully.

By way of summation and review, a test may be conducted to test whether a display unit drives smoothly before mounting a driving circuit unit (which applies a data signal and a gate signal to the display unit during normal operation), i.e., the test may be conducted without the driving circuit being connected. A test pad, through which a test signal is applied, may be used to conduct the test, and then the test pad may be disabled after all tests are completed. When disabled, a disable voltage may be stably applied to all test pads; if a disable voltage is not applied to some of the test pads, the reliability of the flat panel display apparatus may not be guaranteed.

Embodiments described here may provide a display panel in which tolerance of alignment differences between a test pad and a flexible circuit board (which applies a disable voltage stably to all test pads after completing the test) is improved. Embodiments also provide a flat panel display apparatus including the display panel.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A display panel, comprising:

a display unit including a plurality of pixels; and a test pad unit having a plurality of pads configured to transmit a test signal to the display unit during a test period, the plurality of pads being disabled after the test period is completed, the test pad unit including:

a plurality of first pads that transmit the test signal, applied from outside during the test period, to the display unit; and a plurality of second pads and an auxiliary pad that disable the plurality of first pads when the test period is completed.

2. The display panel as claimed in claim 1, wherein the first pads are arranged in a first direction, and the second pads are arranged in a second direction that is different from the first direction.

3. The display panel as claimed in claim 1, wherein the auxiliary pad is electrically connected to one of the second pads.

4. The display panel as claimed in claim 1, wherein the auxiliary pad has a surface area that extends in a direction in which the second pads are arranged.

5. The display panel as claimed in claim 1, wherein the first pads include test data signal pads (D pads) that receive a test data signal from the outside during the test period to transmit the test data signal to the display unit, and a test gate signal pad (G pad) that receives a test gate signal from the outside to transmit the test gate signal to the display unit, the D pads and the G pad being sequentially arranged in a first direction.

6. The display panel as claimed in claim 5, wherein the second pads include a test gate signal pad disable pad (DG pad) that receives a disable voltage from the outside to disable the G pad after the test period is completed, and test data signal pad disable pads (DD pads) that receive the disable voltage from the outside to disable the DD pads, the DG pad and the DD pads being sequentially arranged in a second direction that is different from the first direction.

7. The display panel as claimed in claim 6, wherein:

the first pads and the second pads cross each other, and the G pad and the DG pad are common pads, the G pad and the DG pad being disposed at a contact point where the first pads and the second pads cross each other.

8. The display panel as claimed in claim 6, wherein the auxiliary pad is electrically connected to the DG pad.

9. The display panel as claimed in claim 1, wherein the pixels each include an organic light-emitting device.

10. A flat panel display apparatus, comprising:

a display panel including:

a display unit that includes a plurality of pixels; and a test pad unit configured to transmit a test signal to the display unit during a test period, the test pad unit having a plurality of pads that are disabled after the test period is completed; and a flexible circuit board including a lead terminal portion that is connected to the test pad unit, wherein:

the test pad unit includes:

first pads that transmit the test signal, applied from outside during the test period, to the display unit; and second pads and an auxiliary pad that disable the first pads when the test period is completed, the lead terminal portion applies a common disable voltage to the second pads and the auxiliary pad after the test period is completed, and the lead terminal portion includes:

a main terminal portion that is connected to the second pads; and an auxiliary terminal portion that is connected to the auxiliary pad.

11. The flat panel display apparatus as claimed in claim 10, wherein the first pads are arranged in a first direction, and the second pads are arranged in a second direction that is different from the first direction.

12. The flat panel display apparatus as claimed in claim 10, wherein the auxiliary pad is electrically connected to one of the second pads.

13. The flat panel display apparatus as claimed in claim 10, wherein the auxiliary pad has a surface area that extends in a direction in which the second pads are arranged.

14. The flat panel display apparatus as claimed in claim 10, wherein the first pads include test data signal pads (D pads) that receive a test data signal from the outside during the test period to transmit the test data signal to the display unit, and a test gate signal pad (G pad) that receives a test gate signal from the outside to transmit the test gate signal to the display unit, the D pads and the G pad being sequentially arranged in a first direction.

15. The flat panel display apparatus as claimed in claim 14, wherein the second pads include a test gate signal pad disable pad (DG pad) that receives a disable voltage from the outside to disable the G pad after the test period is completed, and test data signal pad disable pads (DD pads) that receive the disable voltage from the outside to disable the D pads, the DG pad and the DD pads being sequentially arranged in a second direction that is different from the first direction.

16. The flat panel display apparatus as claimed in claim 15, wherein:

the first pads and the second pads cross each other, and the G pad and the DG pad are common pads, the G pad and the DG pad being disposed at a contact point where the first pads and the second pads cross each other.

17. The flat panel display apparatus as claimed in claim 15, wherein the auxiliary pad is electrically connected to the DG pad.

18. The flat panel display apparatus as claimed in claim 15, wherein at least the DD pads are connected to the main terminal portion.

19. The flat panel display apparatus as claimed in claim 18, wherein the DD pads and the DG pad are connected to the main terminal portion.

20. The flat panel display apparatus as claimed in claim 10, further comprising a driving circuit unit that is electrically connected to the flexible circuit board, the driving circuit unit applying the common disable voltage to the second pads and the auxiliary pad after the test period is completed.

21. The flat panel display apparatus as claimed in claim 20, further comprising a driving pad unit that is included in the display panel and supplies power and control signals, the power and control signals being received from the driving circuit unit when driving the display unit, wherein the driving circuit unit applies the power and control signals to the driving pad unit when driving the display unit.

22. The flat panel display apparatus as claimed in claim 10, wherein the pixels each include an organic light-emitting device.

* * * * *